United States Patent
Jain et al.

(10) Patent No.: US 7,047,175 B1
(45) Date of Patent: May 16, 2006

(54) SYSTEM AND METHOD FOR ENHANCING THE SPEED OF DYNAMIC TIMING SIMULATION USING DELAY ASSESSMENT AT COMPILE TIME

(75) Inventors: Manish Jain, Cupertino, CA (US); Badri P. Gopalan, Sunnyvale, CA (US)

(73) Assignee: Synopsys, Inc., Mountain View, CA (US)

( * ) Notice: Subject to any disclaimer, the term of this patent is extended or adjusted under 35 U.S.C. 154(b) by 752 days.

(21) Appl. No.: 10/015,180

(22) Filed: Nov. 16, 2001

(51) Int. Cl.
*G06F 17/50* (2006.01)

(52) U.S. Cl. .................... 703/19; 713/500; 713/502; 716/6

(58) Field of Classification Search ............... 703/14, 703/19; 714/741, 55; 716/6; 326/113; 713/500, 713/502
See application file for complete search history.

(56) References Cited

U.S. PATENT DOCUMENTS

| | | | | |
|---|---|---|---|---|
| 4,584,653 A | * | 4/1986 | Chih et al. | 716/17 |
| 5,379,231 A | * | 1/1995 | Pillage et al. | 703/14 |
| 5,553,276 A | * | 9/1996 | Dean | 713/500 |
| 5,629,859 A | * | 5/1997 | Agarwala et al. | 716/6 |
| 5,696,694 A | * | 12/1997 | Khouja et al. | 716/5 |
| 5,754,826 A | * | 5/1998 | Gamal et al. | 703/14 |
| 6,058,252 A | * | 5/2000 | Noll et al. | 716/10 |
| 6,108,793 A | * | 8/2000 | Fujii et al. | 713/400 |
| 6,323,690 B1 | * | 11/2001 | Yamashita et al. | 326/113 |

OTHER PUBLICATIONS

Pandey et al., "VHDL Semantics and Validateing Transformations" IEEE Jul. 1999, vol. 18., No. 7. p., 936-955.*
Gregory-B., "Avoiding HDL Synthesis Pitfalls" Synopsis Inc. 1994, Electronic Product Design vol. 15, No. 2, p. 23-24.*

* cited by examiner

*Primary Examiner*—Paul L. Rodriguez
*Assistant Examiner*—Tom Stevens
(74) *Attorney, Agent, or Firm*—Bever, Hoffman & Harms, LLP; Jeanette S. Harms

(57) ABSTRACT

A method and system for reducing the time required for execution of the dynamic timing simulation for a logic simulator. For a logic circuit simulator having a compilation phase and a runtime phase, a delay assessment is performed during the compilation phase in order to identify storage elements that are exempt from possible timing violations at runtime. The runtime timing checks are removed from the exempt storage elements, thereby reducing the runtime calculation effort. Additionally, combinational portions of the circuit that drive the exempt storage elements are examined for element delays that can be effectively eliminated (e.g., zero delayed) from the runtime calculations, thereby providing a further reduction in the computational overhead via the use of cycle based simulation for these.

44 Claims, 11 Drawing Sheets

| $T_{qi}$ | $T_{sj}$ | $T_{hj}$ | Hold Time Constraint | Minimum Forward Delay Sum | Maximum Forward Delay Sum | Setup Time Constraint | Output Node |
|---|---|---|---|---|---|---|---|
| 2 | 12 | 9 | 7 | 10 | 10 | 26 | D |
| 2 | 3 | 8 | 6 | 15 | 20 | 35 | E |
| 2 | 19 | 10 | 8 | 15 | 20 | 19 | F |

Clock Period = 40

Setup Time Constraint = Clock Period – $T_{qi}$ – $T_{sj}$

Hold Time Constraint = $T_{hj}$ – $T_{qi}$

Figure 4

SYSTEM AND METHOD FOR ENHANCING THE SPEED OF DYNAMIC TIMING SIMULATION USING DELAY ASSESSMENT AT COMPILE TIME

FIELD OF THE INVENTION

Embodiments of the present invention relate to the field electronic design automation (EDA). More particularly, embodiments of the present invention relate to the simulation of logic circuits.

BACKGROUND ART

The manufacture of integrated circuits at very large scale integration (VLSI), or ultra large scale integration (ULSI), requires a large investment in time and resources. Before committing a circuit design to the manufacturing process it is desirable to validate the circuit design.

Validation of a design is the process of examining the behavior of the design implementation in light of the specification for the design. Validation can be done in a variety of ways and includes both static analysis and dynamic analysis techniques. There are currently many computer aided design (CAD) packages that are used specifically for circuit validation, and these packages are generally referred to as electronic design automation (EDA) tools.

In static analysis the circuit is analyzed without input data and time dependent behavior is not considered. For example, a circuit can be modeled as a resistance-capacitance (RC) tree, or sequential elements followed by combinational elements, in order to determine the approximate maximum signal path delays. Static analysis yields maximum delay information and can be used to find gross design violations; however, it has the disadvantage of occasionally reporting violations for circuit paths that are not used in the operation of the circuit because it does not consider the behavior of the circuit with actual input signals. Conventional static timing also has the disadvantage of reporting violations in parts of the circuit that are not of interest (e.g., previously tested portions of the circuit). Static analysis is also unable to account for data-dependent delays or handle certain circuit topologies.

In dynamic analysis a set of input data is generated and the observation of the time dependent behavior of the circuit is observed in response to the input. The application of a set of input data and the observation of the response is called simulation. In simulation, the design implementation is usually expressed in terms of a netlist that is generated from a hardware description language such as VERILOG or VHDL. Of the EDA tools in use, simulators are the most significant in terms of cost and time.

Due to the complexity of VLSI and ULSI circuits, the cost of a fully comprehensive design simulation is prohibitive, and there are tradeoffs between accuracy, speed and coverage. Thus, considerable effort has been focused on finding ways to improve the speed and efficiency of the simulation process.

Simulators spend time in two separate phases: compilation and runtime. Normally, runtime is the more significant of the two, particularly if the design is being analyzed at the gate level rather than the register transfer level (RTL). Since runtime typically requires considerably more time than compilation, it is desirable to find methods of compiling the circuit for simulation that will reduce the overall time required for the runtime phase.

SUMMARY OF INVENTION

Accordingly, embodiments of the present invention provide a method for accelerating the runtime phase of a logic circuit simulation. Embodiments of the present invention improve the performance of dynamic simulation by assessing the delays during compile time. The improvements in the performance are achieved without sacrificing the accuracy of the dynamic simulation.

A method for reducing the time required for execution of the runtime phase for a logic circuit simulator is disclosed. For a logic circuit simulator having a compilation phase and a runtime phase e.g., dynamic simulation, a delay assessment is performed during the compilation phase in order to identify storage elements that are exempt from possible timing violations at runtime. Runtime timing checks are removed from the exempt storage elements, thereby reducing the dynamic timing simulation effort. Additionally, combinational portions of the circuit that drive the storage elements are examined (during backward traversal processes) for elements that can be effectively eliminated from the dynamic timing simulation calculations (by introducing zero delay). The backward traversal process may be made from all storage elements, or may be limited to origination from exempt (safe) storage elements. The introduction of zero delays in the combinational portion of the circuit provides a further reduction in the computational overhead during dynamic timing simulation, by the use of cycle based simulation for these gates. Similarly, the removal of delays from the clock circuits associated with the sequential elements also provides a significant reduction the computation required during simulation.

In an embodiment of the present invention, a combinational portion of a logic circuit is represented as a network of nodes interconnected by signal paths that have associated delays. The inputs and outputs for the combinational portion of the logic circuit are connected to clocked storage elements, e.g. flip-flops, that are operated with a particular clock period. The maximum and minimum delays at an output flip-flop are determined and compared to the maximum and minimum allowable delays at the output flip-flop. If the maximum delay does not violate the maximum allowable delay and the minimum delay does not violate the minimum allowable delay, then the output flip-flop is referred to as "safe" or "exempt". If either the minimum allowable delay or the maximum allowable delay is violated, the flip-flop is referred to as "unsafe" or "non-exempt".

Timing checks are removed from storage elements that are classified as safe. The removal of timing checks during the compilation phase provides a first reduction in computational effort of dynamic timing simulation. Additionally, the combinational portion of the logic circuit is examined by stepping back along the paths leading into the output flip-flops and path elements having delays that can be removed are identified. A second reduction in computational effort is achieved by removing the identified path element delays from the dynamic timing simulation calculations by setting their value to zero during the compilation phase, as a result of delay assessment information.

In another embodiment, a major reduction in computational effort is achieved by setting the delays associated with the clock skew (e.g. delays associated with clock buffers) to zero for safe output flip-flops that terminate a combinational path. Since clock circuits are essentially always active, the removal of delays from the simulation of the clock circuits is significant.

In yet another embodiment, the clock-to-Q delays of input flip-flops may be removed. Removal of the clock-to-Q delays of input flip-flops is determined by the treatment of the gates connected to the input flip-flops.

In general, for all gates having zero delay, cycle based simulation algorithms can be applied during dynamic timing simulation in one embodiment.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

FIG. 4 shows a delay data table used for delay assessment in accordance with an embodiment of the present claimed invention.

DESCRIPTION OF THE PREFERRED EMBODIMENTS

In the following detailed description of the present invention, a system and method for enhancing the speed of dynamic logic simulation using information obtained from a delay assessment; numerous specific details are set forth in order to provide a thorough understanding of the present invention. However, it will be obvious to one skilled in the art that the present invention may be practiced without these specific details. In other instances well known methods involving schematic representation and the characterization of lumped and distributed circuit properties, etc., have not been described in detail so as not to unnecessarily obscure aspects of the present invention.

Notation and Nomenclature

Some portions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. A procedure, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals a bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the disclosure of the present invention, terms such as "processing" or "computing" or "calculating" or "computing" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system's registers or memories or other such information storage, transmission or display devices.

Figure 1:
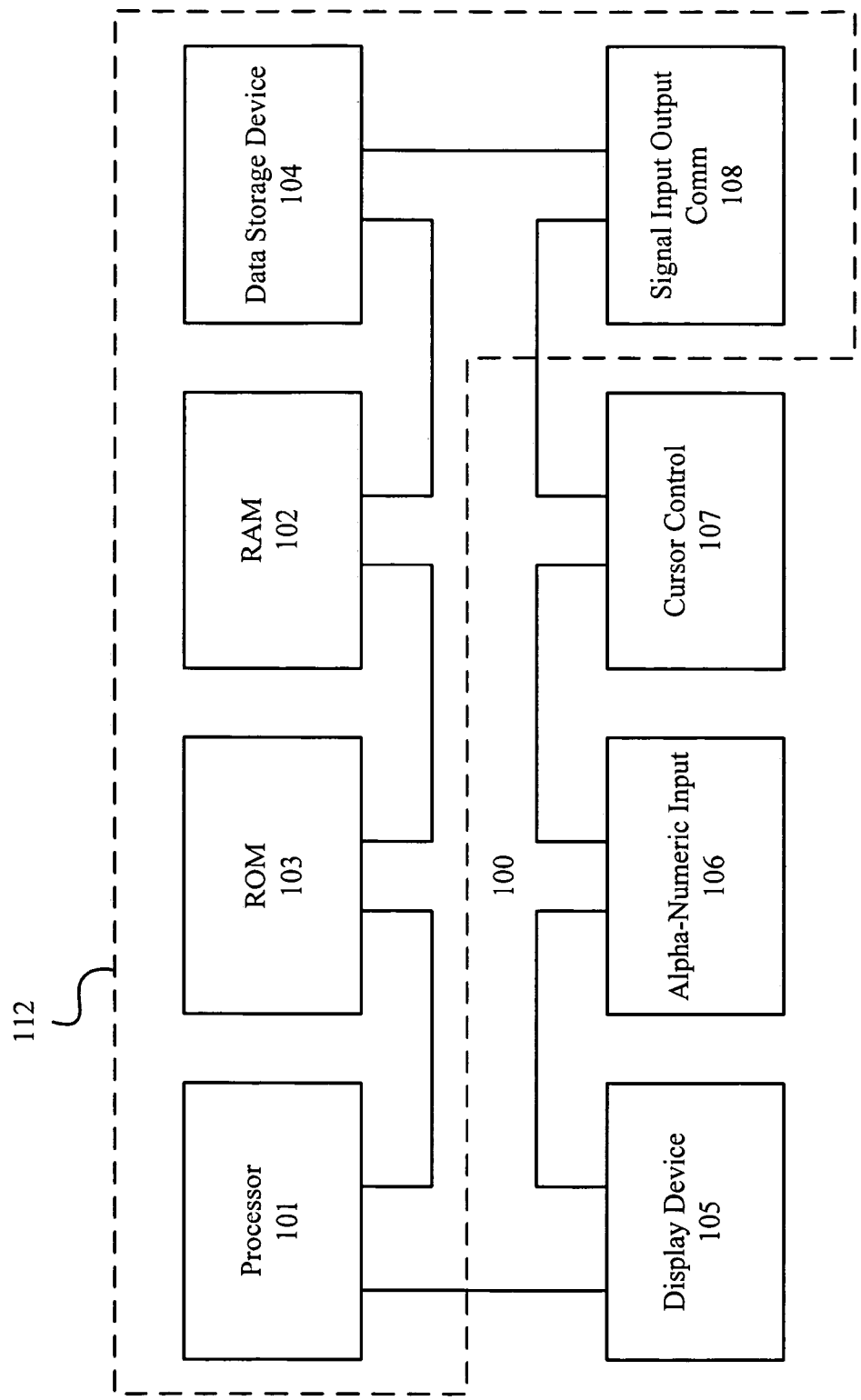
FIG. 1 illustrates a computer system forming a part of a system in accordance with an embodiment of the present claimed invention.

Refer to FIG. 1 which illustrates a general purpose computer system 112. In general, computer systems 112 used by an embodiment of the present invention comprise a bus 100 for communicating information, a central processor 101 coupled with the bus 100 for processing information and instructions, a random access memory 102 coupled with the bus 100 for storing information and instructions for the central processor 101, a read only memory 103 coupled with the bus 100 for storing static information and instructions for the processor 101, a data storage device 104 such as a magnetic or optical disk and disk drive coupled with the bus 100 for storing information and instructions, an optional display device 105 coupled to the bus 100 for displaying information to the computer user, an alphanumeric input device 106 including alphanumeric and function keys coupled to the bus 100 for communicating user input information and command selections to the central processor 101, cursor control device 107 coupled to the bus for communicating user input information and command selections to the central processor 101, and a signal generating device 108 coupled to the bus 100 for communicating command selections to the processor 101.

Figure 2A:
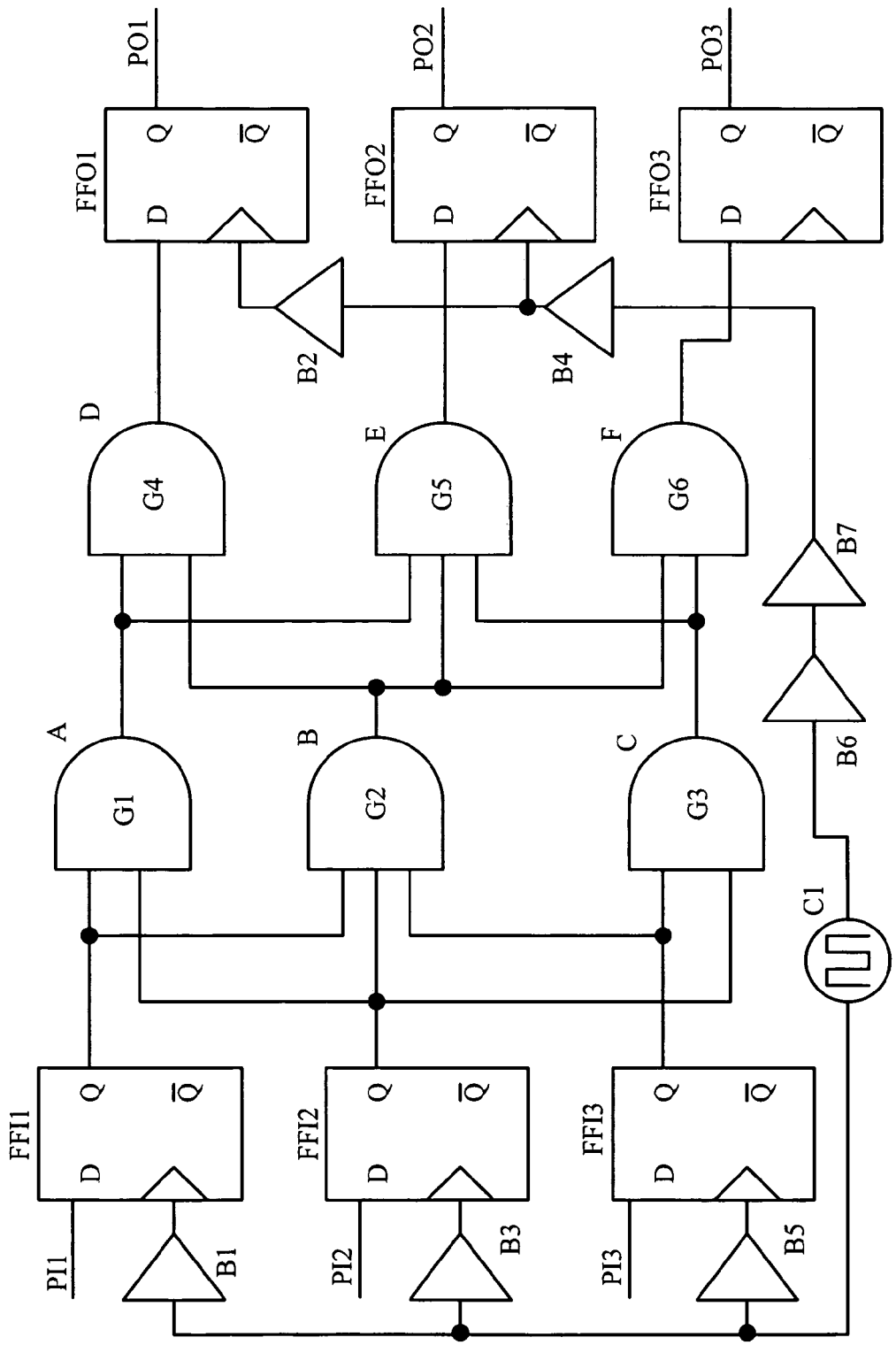
FIG. 2A shows a logic circuit block to which an embodiment of the present claimed invention may be applied.

FIG. 2A shows an example of a logic circuit block 200 to which the present invention may be applied. The circuit includes a master clock C1, input flip-flops FFI1, FFI2, FFI3; output flip-flops FFO1, FFO2, FFO3; logic gates G1, G2, G3, G4, G5, G6; buffers B1, B2, B3, B4, B5, B6, B7. Primary inputs PI1, PI2 and PI3 are provided at input flip-flops FFI1, FFI2 and FFI3, respectively. Primary outputs PO1, PO2 and PO3 are provided at output flip-flops FFO1, FFO2 and FFO3, respectively. The primary outputs and inputs may also be intermediate input and outputs without a loss of generality. the primary inputs may terminate a preceding combinational path and the primary outputs may feed a succeeding combinational path. Each gate, flip-flop and buffer has associated delays that must normally be accounted for during dynamic simulation. In a method embodiment of the present invention the delays of these circuit elements are assessed, and subject to certain criteria, may be removed from the dynamic simulation.

Figure 2B:
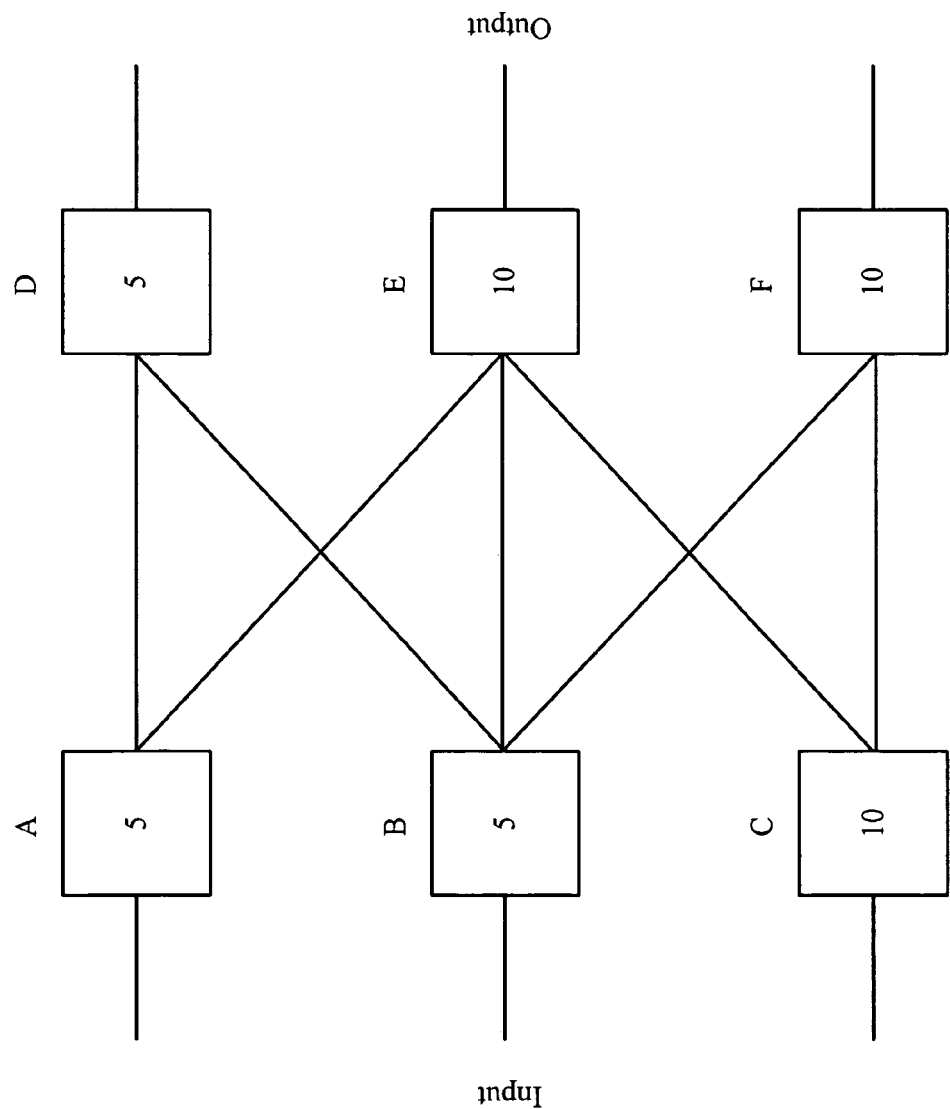
FIG. 2B shows a delay schematic for the combinational portion of the logic circuit of FIG. 2A.

FIG. 2B shows a logic circuit delay schematic for the combinational portion of the logic circuit of FIG. 2A. The nodes labeled A, B, and C represent gates G1, G2, and G3 respectively. The nodes labeled D, E, and F represent gates G4, G5, and G6 respectively. The nodes A, B, C, D, E, and F have delays of 5, 5, 10, 5, 10, and 10 nanoseconds, respectively. The schematic is intended to show the paths traversed during the delay assessment of the present invention and as such does not reflect the electrical connections of FIG. 2A. Each node contains a delay associated with its respective gate. In this example, a single value is shown; however, the gate delays may be data dependent. Also, for purposes of this example, the interconnect delays are assumed to be zero so that present invention may be clearly described by a quantitative example. In practice, the interconnect delays are typically provided in a standard delay format (SDF) file and accounted for.

A purely combinational path bounded by an input flip-flop $FF_i$ and an output flip-flop $FF_j$ will by constrained by upper and lower bounds with regard to the total permissible delay for data from the input flip-flop $FF_i$. The upper bound is established by the clock period P minus the setup time $Ts_j$ for the output flip-flop $FF_j$. The sum of the clock-to-Q delay $Tq_i$ of the input flip-flop $FF_i$ and the delay associated with the combinational portion must be less than or equal to $P-Ts_j$. Equivalently, the delay associated with the combinational path must be less than or equal to $P-Tq_i-Ts_j$. This constraint is referred to as the setup time constraint.

The lower bound for the permissible delay associated with the input flip-flop $FF_i$ and the combinational path is established by the clock period P and the hold time $Th_j$ of the output flip-flop $FF_j$. The delay associated with the combinational path must be greater than or equal to $P-Th_j-Tq_i$. This constraint is referred to as the hold time constraint.

A "safe delay period" that is greater than or equal to the hold time constraint and less than or equal to the setup time constraint is thus established at each output flip_flop $FF_j$ for the allowable accumulated delay for an associated combinational path. The output flip-flops $FF_j$ are characterized as either safe or non-safe on the basis of the safe delay period, with an output flip-flop being characterized as safe if the delays of all associated combinational paths fall within the safe delay period of the flip-flop.

The safe delay period may also account for the effects of clock skew between the $FF_i$ and $FF_j$ that bound a combinational path. The clock delay at the input flip-flops $FF_i$ with respect to the master clock is added to the safe delay period, and the clock delay at the output flip-flops $FF_j$ with respect to the master clock is subtracted from the safe delay period.

If an output flip-flop $FF_j$ has an associated combinational path for which the total delay exceeds the safe delay period, it is classified as non-exempt or non-safe. If all combinational paths associated with an output flip-flop $FF_j$ are within the safe delay period, then the $FF_j$ is classified as safe or exempt.

The delays associated with a physical circuit path in a logic circuit are generally attributable to a combination of lumped and distributed resistances and capacitances associated with the devices and their interconnects. Thus both devices (e.g., a gate or a single transistor) and their interconnects may contribute to the total delay in a circuit path. Depending upon the desired resolution, the fundamental device used in delay assessment can be an individual transistor, a gate, or a larger logic block. Generally, a gate is used as the fundamental circuit element.

For logic circuit elements, data dependent delays may introduce several different alternative values for delays that are dependent upon the nature of a transition at a gate. For example, if there are four logic states available at the input and output of a gate, there will be twelve possible transitions, and each transition may have a different delay associated with it. The delay parameters are usually available at compile time in a standard delay format (SDF) file. For simplicity, the present example shows a single delay value for all transitions.

Data dependent delays may also be found cascaded in a combinational path. Consecutive data dependent delays may be combined as necessary for accurate delay assessment. For example, a buffer followed by an inverter will have a rise delay added to a fall delay, respectively.

In a method embodiment of the present invention, the total delay associated with each possible forward path at a node is determined for each node. For example, nodes A, B, and C have forward delays of 5, 5, and 10 nanoseconds. Nodes D, E, and F have multiple associated delays since there are multiple inputs.

Figure 3:
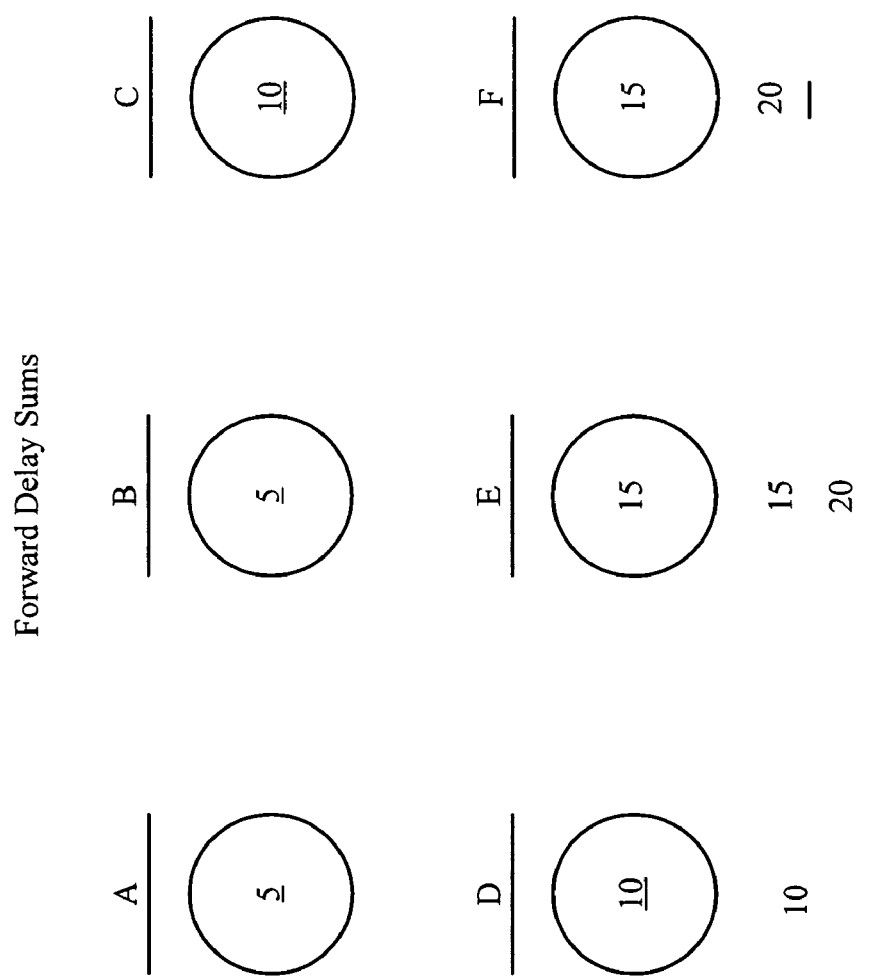
FIG. 3 shows a table for forward delay sums produced in accordance with an embodiment of the present claimed invention.

FIG. 3 shows a tabulation of all of the possible forward delay sums associated with the paths traversing the schematic of FIG. 2B. In the forward traverse, the delays are summed across each node to provide a forward delay sum at the output of the node. For each node, there is a maximum forward delay sum and a minimum forward delay sum. The maximum forward delay sum for each node in FIG. 3 is underlined, and the minimum forward delay sum is circled.

FIG. 4 shows a delay data table used for delay assessment in accordance with an embodiment of the present claimed invention. Delay data is shown for output nodes G, H and I. Nodes G, H, and I are associated with the inputs of output flip-flops FFO1, FFO2, and FFO3 of FIG. 2A, respectively. For this example, the clock period of the master clock C1 of FIG. 2A is 40 nanoseconds. $T_{qi}$, $T_{sj}$, and $T_{hj}$ represent the clock-to-Q of the input flip_flop, setup time of the output flip_flop, and hold time of the output flip-flop, respectively.

It should be noted that the scheme shown in FIG. 4 is only one example of an approach for obtaining a lower bound (minimum allowable combinational delay) or hold time constraint, and an upper bound (maximum allowable combinational delay) or setup time constraint. These upper and lower bounds on the delay allowed in the combinational portion of the circuit may be derived from other techniques.

Referring again to FIG. 4, the minimum forward delay sum is compared to the hold time constraint (lower bound), and the maximum forward delay sum is compared to the setup time constraint (upper bound). If the minimum forward delay sum is greater (or equal to) than the hold time constraint, and the maximum forward delay sum is less than (or equal to) the setup time constraint, the output flip-flop associated with the output node is considered safe. This comparison is made at each output node, and if either the minimum or maximum constraint is violated, then the node is considered unsafe.

Figure 6:
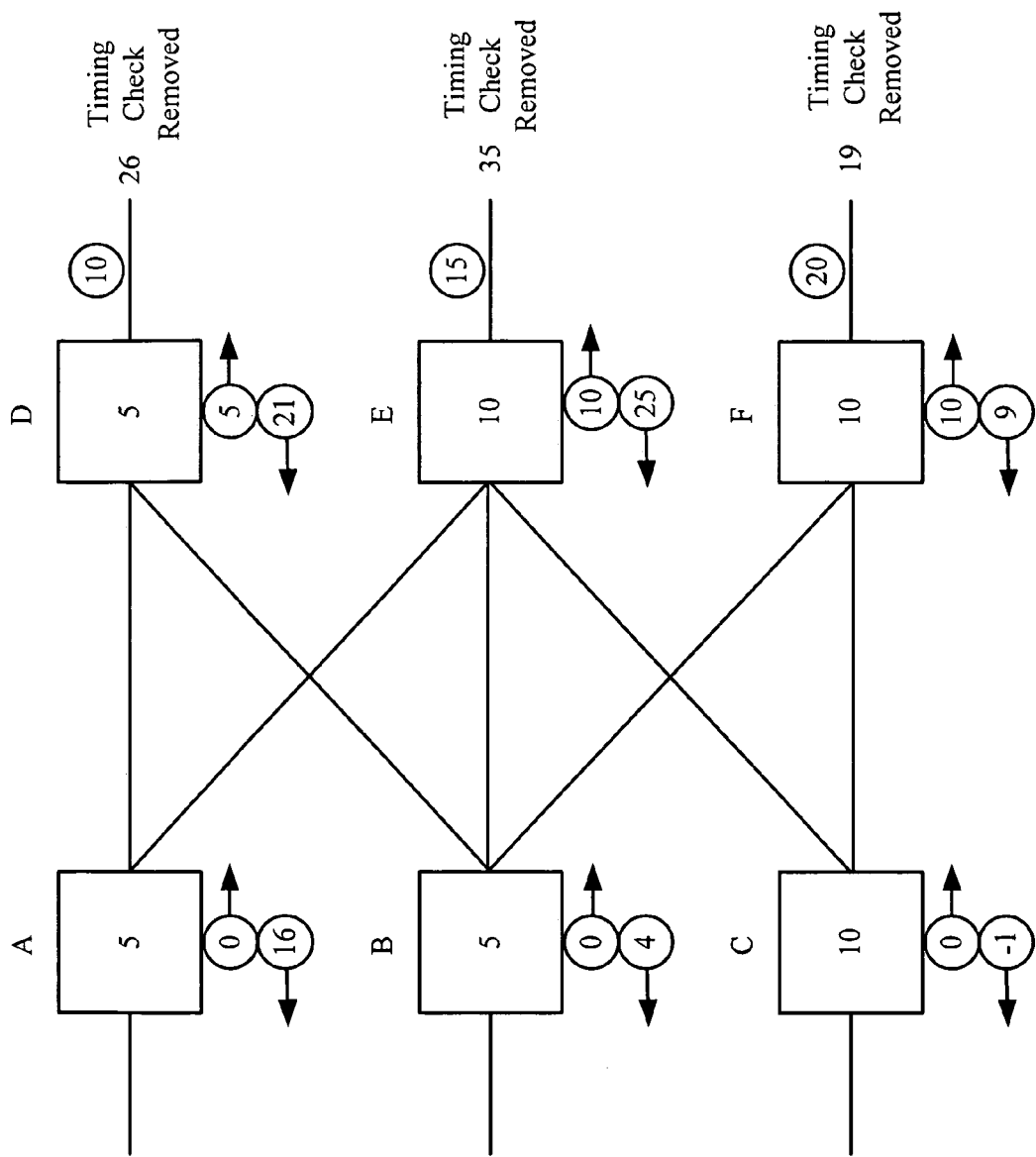
FIG. 6 shows the logic circuit delay schematic of FIG. 2B with maximum forward delay sums and minimum reverse delay differences assigned to nodes in accordance with an embodiment of the present invention.

In the example of FIG. 4, Output Nodes D (10 less than 20) and E (15 less than 35) are safe, whereas maximum forward delay sum of Output Node F (20 greater than 19) violates the setup time constraint, and thus the flip-flop associated with Output Node F is unsafe. The safe and unsafe designation is shown in FIG. 6. Thus, output flip-flops FFO1 and FFO2 of FIG. 2A would be safe, and output flip-flop FFO3 of FIG. 2A would be unsafe. The timing checks that are conventionally in place during dynamic simulation are removed during compile time from the nodes that are found to be safe.

In addition to removing the timing checks on output flip-flops that are safe, the delays associated with the clock buffers that drive the safe flip-flops are removed as well. Thus, the delays that are associated with buffers B2 and B4 of FIG. 2A would be removed during dynamic simulation.

Figure 5:
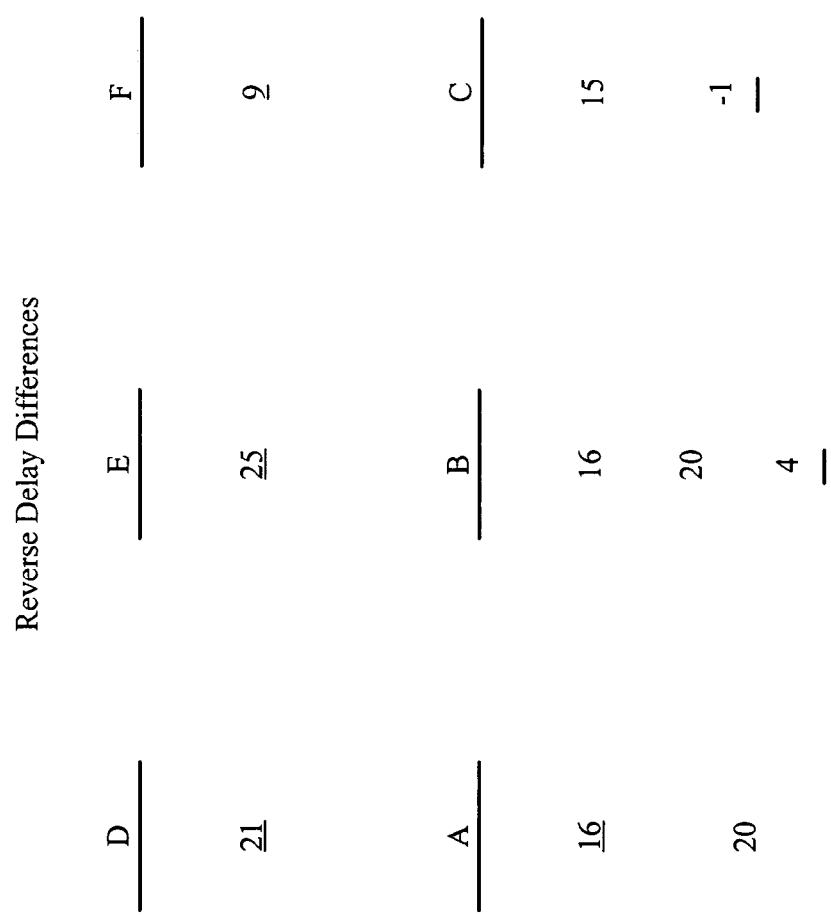
FIG. 5 shows a table for reverse delay differences produced in accordance with an embodiment of the present claimed invention.

FIG. 5 shows a table for reverse delay differences produced in accordance with an embodiment of the present claimed invention. Referring again to FIG. 2B, a series of reverse delay differences is obtained by a backward traversal from each output node along each possible combinational path. Starting from the output node, the delay associated with each node is subtracted from the setup time constraint (upper bound) and assigned to the input side of the node as a reverse delay difference. for example, the reverse delay difference at node D is equal to: 26 (setup time constraint for node G from FIG. 4)−5 (delay associated with node D)=21. Similarly, the reverse delay difference at node A from path DA is equal to 26−5−5=16. The minimum reverse delay difference for each node is underlined in FIG. 5.

FIG. 6 shows the logic schematic of FIG. 2B with the addition of a comparison of forward maximum delay sums and minimum reverse delay differences. The maximum forward delay sums are shown in circles with an arrow pointing to the right, and the minimum reverse delay differences are shown with an arrow pointing to the left. At a given node, the maximum delay sum represents the worst case (greatest) delay sum for all paths leading into that node. Similarly, the minimum reverse delay difference represents the amount of delay that can be tolerated in any path entering the node, such that total delay does not violate the setup time constraint (upper bound).

If the minimum reverse delay difference at a node is greater than the forward maximum delay difference at that node, then all adjacent nodes on paths leading forward out of the node can have their associated delays set to zero during compile time without compromising the accuracy of the dynamic simulation. Forward delay sums and reverse delay differences may include the delays associated with interconnects. For example, the delay sums shown in FIG. 3 for node A would be incremented by some amount when compared to the reverse delay difference at node D or node E. Similarly, the reverse delay differences would be decremented by some amount.

The reduction to zero of delays can also be extended to the clock-to-Q delay associated with an input flip—flip such as FFI1, FFI2, and FFI3 of FIG. 2A. An input flip-flop having one or more gates connected to its output may have its clock-to-Q delay reduced to zero during compile time if all of the connected gates have had their delays reduced to zero. The elimination of the clock-to-Q delay at qualified input flip-flops provides a further improvement in dynamic simulation. The reduction to zero of delays associated with gates and flip-flops will also be influenced by whether a standard or aggressive optimization is used.

Figure 7A:
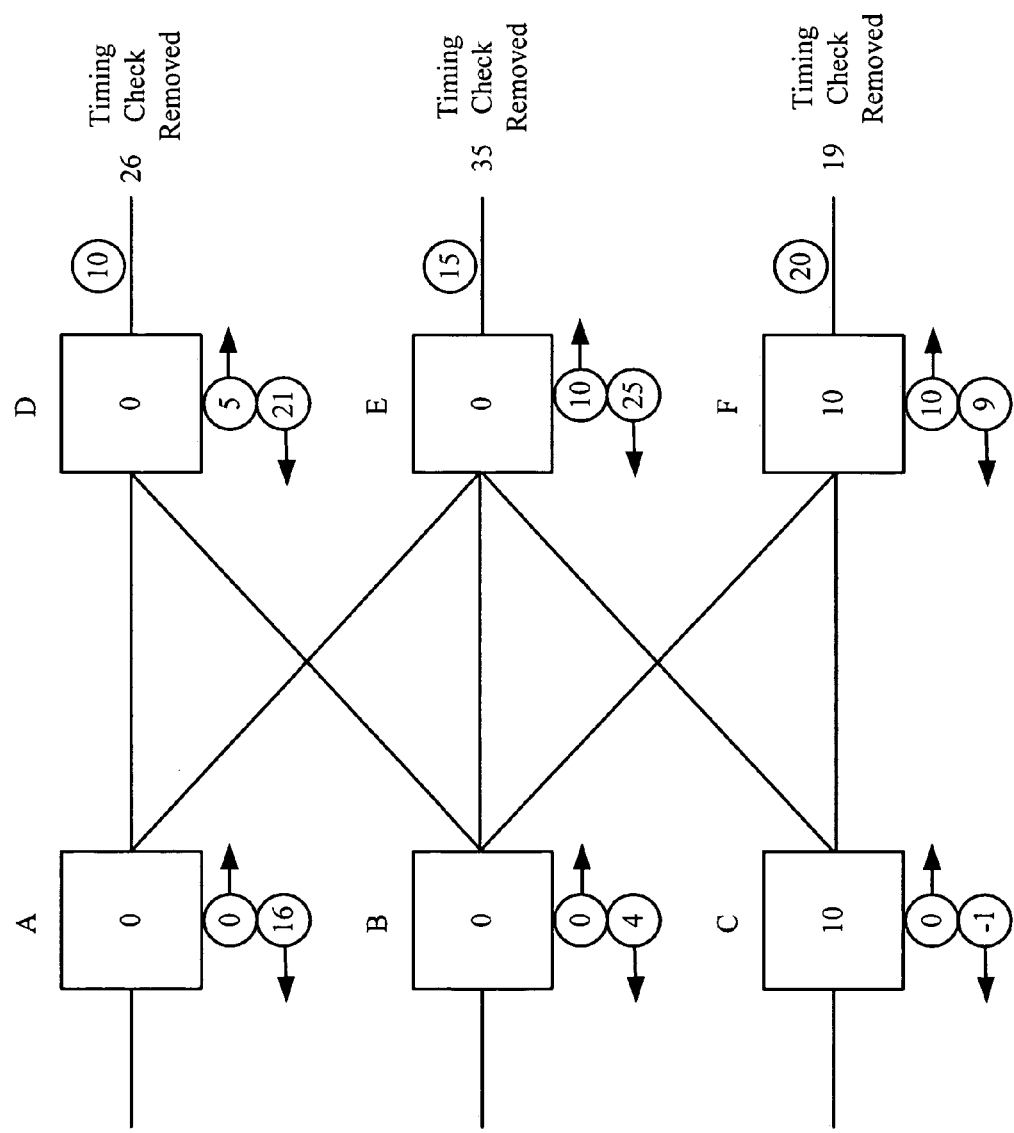
FIG. 7A shows the delay removal associated with an aggressive optimization in accordance with an embodiment of the present invention.

FIG. 7A shows a "reduced" logic circuit schematic of FIG. 6, with selected delays set to zero and selected timing checks removed. Each node that meets the criterion of having a reverse minimum delay difference that is greater than the forward maximum delay sum is set to zero delay. The reduction shown in FIG. 7A is referred to as an aggressive optimization. Only Nodes C and F retain non-zero delay values, whereas the remainder are set to zero for purposes of dynamic simulation. With respect to the application of aggressive optimization to FIG. 2A, the input flip-flops FFI1 and FFI2 would have their clock-to-Q delays removed for dynamic simulation, whereas FFI3 would not.

Figure 7B:
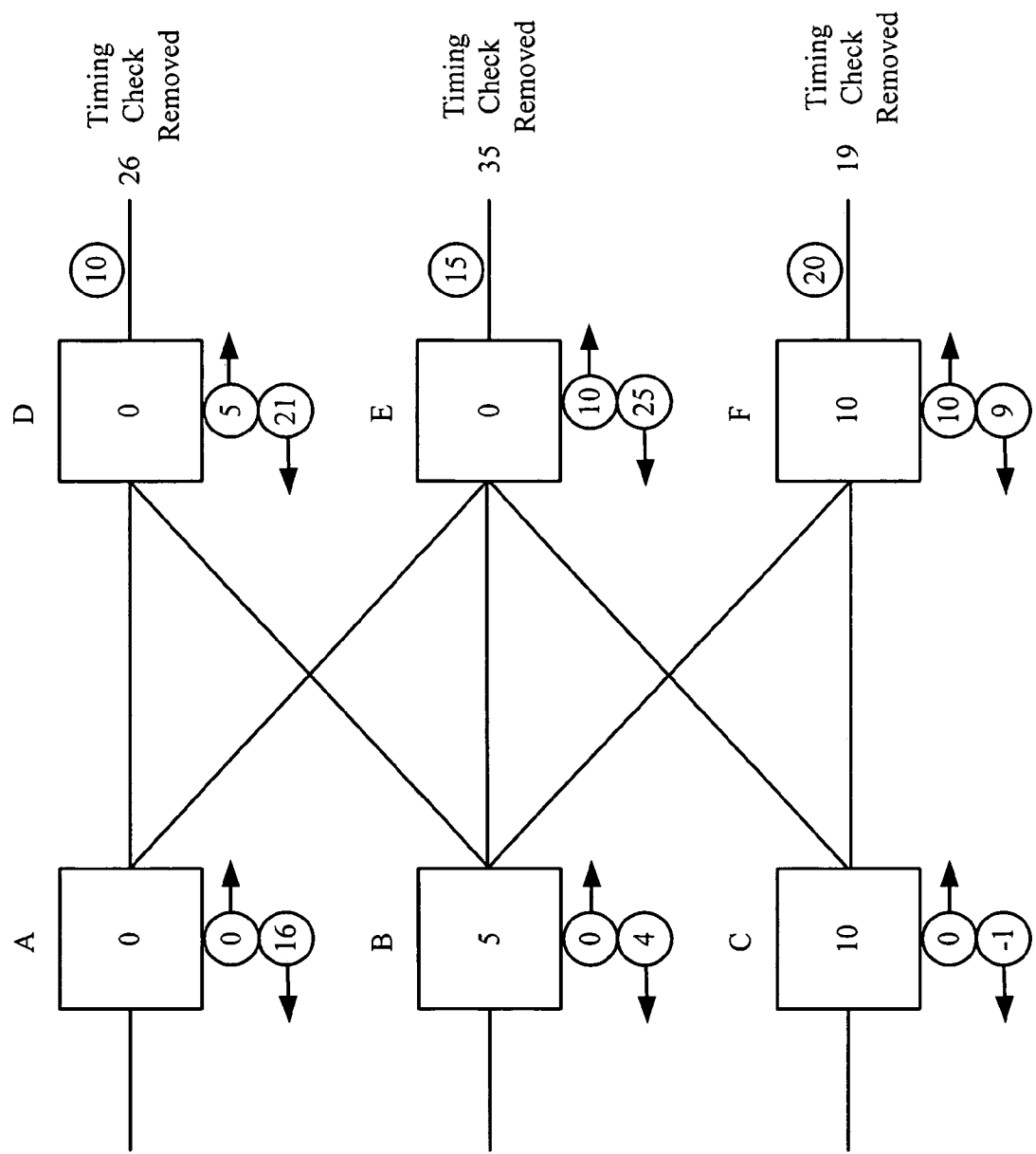
FIG. 7B shows the delay removal associated with a standard optimization in accordance with an embodiment of the present invention.

FIG. 7B shows a "reduced" logic circuit schematic similar to that of FIG. 7A, with a standard optimization used in place of an aggressive optimization. Standard optimization has the constraint that nodes on combinational paths connected to an unsafe node are not eligible for reduction to zero. Thus, standard optimization has three nodes that have not been reduced to zero (nodes B, C, and F). With respect to the application of standard optimization to FIG. 2A, input flip-flop FFI1 would have its clock-to-Q delay removed for dynamic simulation, whereas FFI2 and FFI3 would not.

Since timing checks are not removed from unsafe nodes due to the potential for timing violations, the standard optimization prevents the introduction of "zeroed" delays in paths leading to unsafe nodes. The introduction of a zeroed path element may in remote cases distort the timing information reported at an unsafe node.

It should be noted that the "greater than" criterion described above could also be expressed as a greater than or equal" criterion by appropriate adjustment of the safe delay period values or other parameters.

Figure 8:
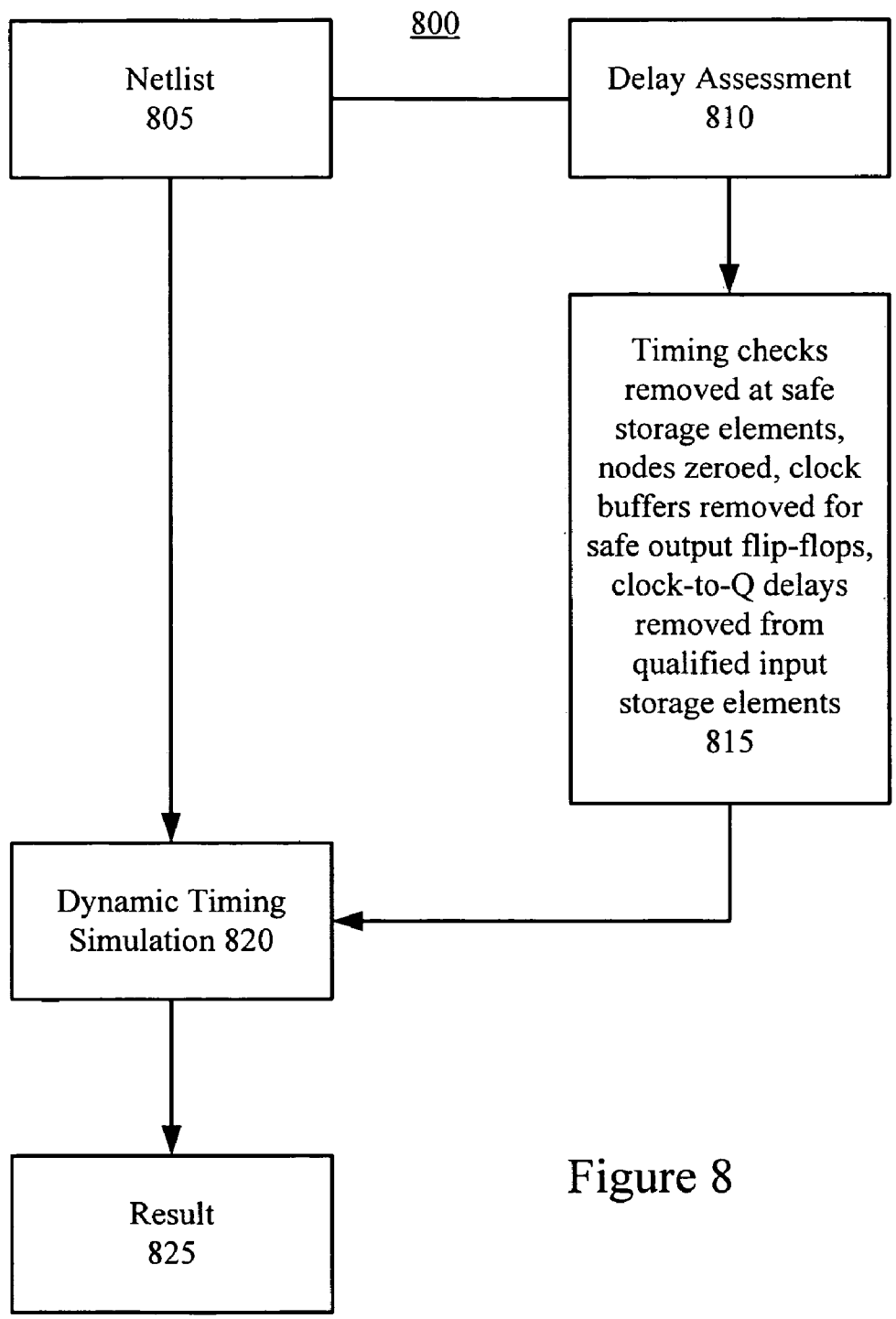
FIG. 8 shows a general flow chart for a method embodiment of the present invention.

FIG. 8 shows flow chart 800 for the general overall process for a method embodiment of the present invention. A netlist 805 is used as input for both a delay assessment step 810 and for a dynamic timing simulation step 820.

In step 810, a delay assessment is performed using the delay data provide by the netlist 805. The delay data may include delays for individual gates or transistors, and may also include delays for interconnect wires between devices. The delay data is typically provided in a standard delay format (SDF) file.

In step 815, timing checks are removed at safe storage elements, and path elements for which delays can be set to zero are identified. Additionally, the clock buffers driving safe output storage elements may be zeroed, and the clock-to-Q delays of qualified input storage elements (flip-flops) may be zeroed.

In step 820, the data from the netlist 805 and the revised timing checks and delays from step 815 are combined to perform the dynamic timing simulation with a reduced overhead to give the result 825.

Figure 9:
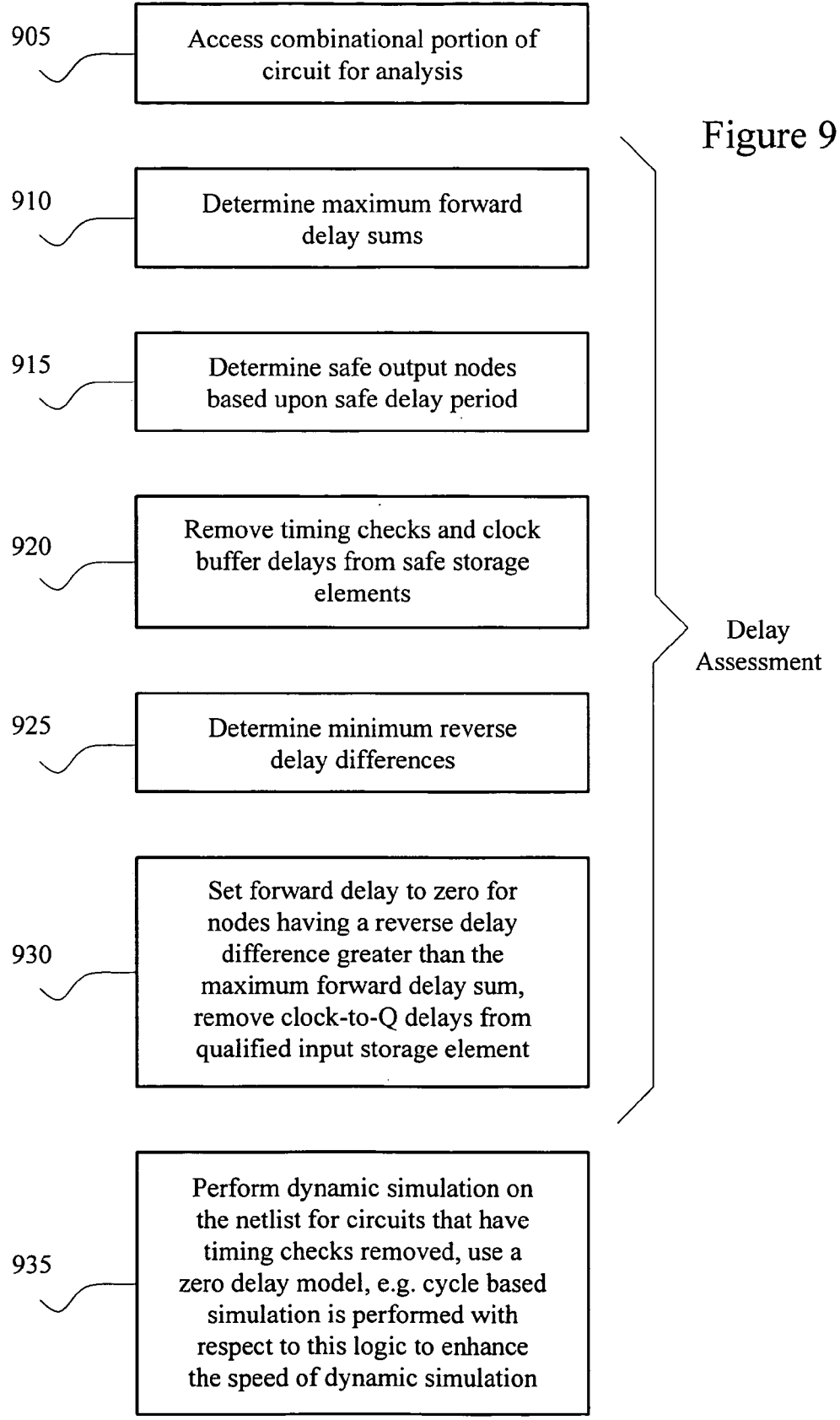
FIG. 9 shows a general flow chart for the determination of forward maximum delay sums and reverse minimum delay differences in accordance with a method embodiment of the present invention.

FIG. 9 shows flow chart 900 for a method embodiment of the present invention. The series of steps shown describe the actions performed during compilation of a logic circuit simulation. It should be noted that the steps shown are not required to be performed in the sequence shown.

In step 905, a combinational portion of the circuit is defined. The combinational circuit portion will typically be represented as a network of input nodes, interior nodes and output nodes that are interconnected. The delays associated with the path elements correspond to the delays found in the interconnects and devices (e.g., gates) of the circuit being simulated. Logic signals are propagated from the input nodes of the circuit through the network to the output nodes. The output nodes are typically associated with storage elements, for example, flip-flops that may share a common clock domain with the combinational circuit portion being simulated.

In step 910, the forward delay sums for each node are determined. At the input nodes the delay sum is nominally zero. The reference point for delay assessment at the input may be set before or after an input storage element. For each interior node and each output node the delay along each path entering the node is found by adding the delays associated with the path elements that make up the path. The largest value for the forward delay sums at a node is designated as the maximum forward delay sum for that node. Examples of path elements are gates and interconnects.

In one approach to determining the maximum forward delay sum at a given node, all possible delay sums are determined and the largest value is selected, with the process being repeated for each node. In an alternative approach, the maximum forward delay sum is determined node by node, using the forward maximum delay sum value from a connected node on as the basis for the sum at the next node, thus avoiding the repetition of calculating intermediate sums.

In step 915, the safe delay period at each output node is determined. For example, the safe delay period may have the hold time constraint as a lower bound and the setup time constraint as an upper bound. Based upon the safe delay period, the output nodes are classified as safe or unsafe. If all of the combinational paths leading in to an output node are within the safe period, the node is safe. If an output node is connected to a path that violates either the hold time constraint (lower bound) or the setup time constraint (upper bound), the node is unsafe.

In step 920, the timing checks are removed from the safe storage elements. A storage element associated with an output node is considered safe if the maximum forward delay sum at an output node is less than the safe delay period for that node. The removal of timing checks provides a reduction in the computational overhead. The removal of the timing checks may also include the setting to zero of clock buffers driving the safe output storage elements, while retaining the delays of clock buffers driving unsafe output storage elements.

In step 925, the minimum reverse delay difference for each node is determined. Beginning at each output storage element, a delay difference is found for each connected node by subtracting the delay associated with the node from the upper bound (setup time constraint). In aggressive optimization, the backward traversal is initiated at output storage elements, whereas in the standard optimization the backward traversal is not performed on paths connected to unsafe output storage elements. One or more delay differences may be calculated at a given node, and the lowest value is designated as the minimum reverse delay difference. At each node in a given path, the reverse delay difference may be determined with respect to each adjacent connected node by using the minimum delay difference at the adjacent connected node. A reverse delay difference at a given node is found by subtracting delay at the node from the reverse delay differences of the preceding connected nodes. Interconnect delays may also be subtracted as appropriate.

In step 930, the maximum forward delay sum and the minimum reverse delay difference at each node other than the output nodes is compared. Delays at nodes having a reverse minimum delay difference that is greater than the forward maximum delay sum can be ignored, and are set to zero for compilation purposes. This elimination of combinational delays further decreases the runtime phase computational overhead. In addition, those input storage elements for which all connected combinational elements have been reduced to zero are qualified (for delay reduction to zero), and their associated clock-to-Q delays are set to zero. If an input storage element is connected to gate that has not had its delay zeroed, the clock-to-Q delay remains.

In step 935, a dynamic simulation is performed for the netlist. Cycle based simulation may be used for those storage elements for which timing checks have been removed, and path element delays for which delays have been set to zero are effectively ignored.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the claims appended hereto and their equivalents.

The invention claimed is:

1. A method for enhancing dynamic timing simulation comprising:
   accessing a netlist comprising combinational logic nodes, including output nodes, interconnections, and input and output storage elements;
   assigning a delay to each of said nodes;
   determining a maximum forward delay sum for each node;
   determining a safe delay period for each of said output nodes;
   removing timing checks from those output nodes for which the maximum forward delay sum is less than the safe delay period;
   determining a minimum reverse delay difference for each of a portion of said nodes;
   identifying the nodes for which the minimum reverse delay difference is greater than the maximum forward delay sum;
   setting the delays for the identified nodes to zero; and
   performing dynamic timing simulation.

2. The method of claim 1, wherein the forward maximum delay sum includes an interconnect delay.

3. The method of claim 1, wherein the delay assigned to at least one of said nodes is derived from a gate delay.

4. The method of claim 1, wherein the fundamental unit for deriving the node delays is a gate.

5. The method of claim 1, wherein at least one of said output nodes is associated with a sequential element.

6. The method of claim 5, wherein said sequential element is a flip-flop.

7. The method of claim 6, further including the setting to zero of delays associated with clock circuit buffers driving said flip-flop.

8. The method of claim 5, wherein said safe delay period is derived from a clock period minus a setup time.

9. The method of claim 1, further including accessing a standard delay format (SDF) file to obtain delay information.

10. The method of claim 9, wherein said delay information relates to data dependent delays.

11. The method of claim 1, further including setting the clock-to-Q delay to zero for input storage elements that have had the delays of all connected nodes set to zero.

12. A computer readable medium containing executable instructions which, when executed in a processing system, causes the system to perform the steps for enhancing the runtime speed of a logic simulator, comprising:
   defining a combinational portion of a logic circuit as a network comprising nodes, including output nodes, interconnections, and input and output storage elements;
   assigning a delay to each of said nodes;

determining a maximum forward delay sum for each node; determining a safe delay period for each of said output nodes;

removing timing checks from those output nodes for which the maximum forward delay sum is less than the safe delay period;

determining a minimum reverse delay difference for each of a portion of said nodes;

identifying the nodes for which the minimum reverse delay difference is greater than the maximum forward delay sum;

setting the delays for the identified nodes to zero; and compiling the logic simulator.

13. The computer readable medium of claim 12, wherein the forward maximum delay sum includes an interconnect delay.

14. The computer readable medium of claim 12, wherein the delay assigned to at least one of said nodes is a gate delay.

15. The computer readable medium of claim 12, wherein the fundamental unit for deriving the node delays is a gate.

16. The computer readable medium of claim 12, wherein at least one of said output nodes is associated with a storage element.

17. The computer readable medium of claim 16, wherein said storage element is a flip-flop.

18. The computer readable medium of claim 17, further including instructions for zero delays associated with clock circuit buffers driving said flip-flop.

19. The computer readable medium of claim 12, wherein said safe delay period is derived from a clock period and a setup time.

20. The computer readable medium of claim 19, further including instructions for accessing a standard delay format (SDF) file to obtain delay information.

21. The computer readable medium of claim 20, wherein said delay information relates to data dependent delays.

22. The computer readable medium of claim 19, further including instructions for setting the clock-to-Q delay to zero for input storage elements that have had the delays of all connected nodes set to zero.

23. A system for enhancing the runtime speed of a logic simulator comprising a computer system, said computer system further comprising instructions for:

defining a combinational portion of a logic circuit as a network comprising nodes, including output nodes, interconnections, and input and output storage elements;

assigning a delay to each of said nodes;

determining a maximum forward delay sum for each node;

determining a safe delay period for each of said output nodes;

removing timing checks from those output nodes for which the maximum forward delay sum is less than the safe delay period;

determining a minimum reverse delay difference for each of said interior nodes and said input nodes;

identifying the nodes for which the minimum reverse delay difference is greater than the maximum forward delay sum;

setting the delays for the identified nodes to zero; and compiling the logic simulator.

24. The system of claim 23, wherein the forward maximum delay sum includes an interconnect delay.

25. The system of claim 23, wherein the delay assigned to at least one of said nodes is from a gate delay.

26. The system of claim 23, wherein the fundamental unit for deriving the node delays is a gate.

27. The system of claim 23, wherein at least one of said output nodes is associated with a storage element.

28. The system of claim 27, wherein said storage element is a flip-flop.

29. The system of claim 28, wherein said computer system comprises instructions for setting to zero of delays associated with clock circuit buffers driving said flip-flop.

30. The system of claim 23, wherein said safe delay period is derived from a clock period and a setup time.

31. The system of claim 23, wherein said computer system comprises instructions for accessing a standard delay format (SDF) file to obtain delay information.

32. The system of claim 31, wherein said delay information relates to data dependent delays.

33. A method of performing dynamic simulation comprising:

a) performing a delay assessment on a netlist comprising and sequential cells, said delay assessment assigning information for respective nodes in said netlist;

b) removing timing checks on sequential elements indicated as exempt from timing checks based on said delay information;

c) assigning zero delay to certain gates based on said delay information; and d) performing dynamic simulation on said netlist, wherein said dynamic simulation enhances performance by:

performing cycle based simulation with respect to gates having assigned thereto zero delay as indicated by c); and skipping timing checks for exempt sequential elements as indicated by b).

34. A method as described in claim 33 wherein said delay information indicates a maximum delay at each node.

35. A method as described in claim 33 wherein said delay assessment comprises:

a1) at each input node of said netlist, starting with a zero delay and traversing forward through each circuit path of said netlist; and a2) during said traversing, aggregating maximum delays and assigning aggregated maximum delays to each node of each circuit path.

36. A method as described in claim 33 wherein a) comprises determining exempt sequential elements by identifying output nodes each having a respective aggregated maximum delay that is less than a clock period minus a respective setup delay.

37. A method as described in claim 36 wherein C) comprises:

for each circuit path terminating at an exempt sequential element, traversing backward through such circuit path to determine a partial circuit path for which zero delay can be designated to all gates therein.

38. A method as described in claim 37 wherein said traversing backward comprises:

starting with said clock period minus said setup delay at an exempt sequential cell;

for each node traversed backward, subtracting a gate delay and assigning a lowest delay result value to said each node; and continuing to traverse backward only if said value is greater than said node's aggregate maximum delay.

39. A system comprising a processor coupled to a bus and memory coupled to said bus wherein said memory contains instructions that when executed on said processor implements a method of performing dynamic simulation, said method comprising:

a) performing a delay assessment on a netlist comprising gates and sequential cells, said delay assessment assigning delay information for respective nodes in said netlist;

b) removing timing checks on sequential elements indicated as exempt from timing checks based on said delay information;

c) assigning zero delay to certain gates based on said delay information; and d) performing dynamic simulation on said netlist, wherein said dynamic simulation enhances performance by:
performing cycle based simulation with respect to gates having assigned thereto zero delay as indicated by c); and
skipping timing checks for exempt sequential elements as indicated by b).

40. A system as described in claim 39 wherein said delay information indicates a maximum delay at each node.

41. A system as described in claim 39 wherein said delay assessment comprises:

a1) at each input node of said netlist, starting with a zero delay and traversing forward through each circuit path of said netlist; and a2) during said traversing, aggregating maximum delays and assigning aggregated maximum delays to each node of each circuit path.

42. A system as described in claim 39 wherein a) comprises determining exempt sequential elements by identifying output nodes each having a respective aggregated maximum delay that is less than a clock period minus a respective setup delay.

43. A system as described in claim 42 wherein c) comprises:

for each circuit path terminating at an exempt sequential element, traversing backward through such circuit path to determine a partial circuit path for which zero delay can be designated to all gates therein.

44. A system as described in claim 43 wherein said transversing backward comprises:

starting with said clock period minus said setup delay at an exempt sequential cell;

for each node traversed backward, subtracting a gate delay and assigning a lower delay result value to said each node; and continuing to transverse backward only if said value is greater than said node's aggregate maximum delay.

* * * * *